United States Patent
Perraud et al.

(10) Patent No.: US 8,669,171 B2
(45) Date of Patent: Mar. 11, 2014

(54) METHOD FOR ELIMINATING THE METAL CATALYST RESIDUES ON THE SURFACE OF WIRES PRODUCED BY CATALYTIC GROWTH

(75) Inventors: Simon Perraud, Bandol (FR); Philippe Coronel, Barraux (FR)

(73) Assignee: Commissariat a l'Energie Atmoique et aux Energies Alternatives, Paris (FR)

( * ) Notice: Subject to any disclaimer, the term of this patent is extended or adjusted under 35 U.S.C. 154(b) by 2 days.

(21) Appl. No.: 13/220,395

(22) Filed: Aug. 29, 2011

(65) Prior Publication Data

US 2012/0070964 A1    Mar. 22, 2012

(30) Foreign Application Priority Data

Sep. 22, 2010   (FR) ...................................... 10 57595

(51) Int. Cl.
*H01L 21/20*    (2006.01)
*H01L 21/36*    (2006.01)

(52) U.S. Cl.
USPC ............ 438/584; 438/478; 977/762; 977/938

(58) Field of Classification Search
USPC ......... 438/478, 492–494, 496, 497, 500, 584; 977/762, 938
See application file for complete search history.

(56) References Cited

U.S. PATENT DOCUMENTS

2006/0225162 A1* 10/2006 Yi ................................ 977/754

OTHER PUBLICATIONS

Rapport De Recherche Preliminaire for FR 1057595 dated Jun. 15, 2011 (7 pgs.).
Whang S J et al, Complementary Metal-Oxide-Semiconductor Compatible A1-Catalyzed Silicon Nanowires, Electrochemical and Solid-State Letters, 2007 Electrochemical Society Inc. US, vol. 10, No. 6 (pp. 11-13).
Ming-Che Yang et al, Fabrication of Silicon and Germanium Nanostructures by Combination of Hydrogen Plasma Dry Etching and VLS Mechanism,: Japanese Journal of Applied Rhysici, Part 1 (Regular Papers, Short Notes & Review Papers) Japan Soc. App. Phys. Japan, vol. 44, No. 7B, Jun. 26, 2005 (pp. 5791-5794).
K.W. Kolasinski, Catalytic Growth of Nanowires: Vapor-Liquid-Solid, Vapor-Solid-Solid, Solution-Liquid-Solid and Solid-Liquid-Solid Growth, Current Opinion in Solid Stae and Materials Science 10 (2006 US (pp. 182-191).
M. I. Den Hertog et al, "Control of Gold Surface Diffusion on Si Nanowires," Nano Letters 2008 US vol. 8, No. 5 (pp. 1544-1550).

* cited by examiner

*Primary Examiner* — Calvin Choi
(74) *Attorney, Agent, or Firm* — Harris Beach PLLC

(57) ABSTRACT

A method is provided for eliminating catalyst residues that are present on the surface of solid structures. The solid structures are made from a first material and are obtained by catalytic growth from a substrate. The method includes the following steps: catalytically growing, from the catalyst residues, solid structures made from a second material; and selectively eliminating the solid structures made from the second material, thereby eliminating the catalyst residues.

12 Claims, 2 Drawing Sheets

A)

B)

METHOD FOR ELIMINATING THE METAL CATALYST RESIDUES ON THE SURFACE OF WIRES PRODUCED BY CATALYTIC GROWTH

CROSS REFERENCE TO RELATED APPLICATION

This application claims priority to French Patent Application No. 1057595 filed on Sep. 22, 2010.

FIELD OF INVENTION

This invention concerns a method for eliminating the traces of catalyst residues present on the surface of solid structures, and in particular nanoscale wires, obtained by catalytic growth.

This method is of particular advantage in the field of electronics or photovoltaics, where the presence of residual catalyst brings about significant deterioration in the performance of the devices involved.

BACKGROUND OF THE INVENTION

Solid structures in the form of wires, with a diameter of between a few nanometers and a few millimeters, may be developed by catalytic growth.

The Kolasinski document (Current Opinion in Solid State and Materials Science 10, 182-191 (2006)) describes various alternatives of this technology particularly in relation to:
  catalytic growth mechanisms: vapor-liquid-solid, vapor-solid-solid, and solution-liquid-solid;
  wire types: silicon, germanium, silicon-germanium, silica, alumina, type II-VI semi-conductors, type III-V semi-conductors etc., The catalyst used generally comprises metal pads, made for example from copper, gold, platinum or aluminum, the size of which partly controls the diameter of the wires.

Thus, the nanowires, of silicon for example, are grown from a metal catalyst in drop form. By injecting a silicon carrier gas, the wire grows under the metal pad and draws it along with it. The catalyst drop thus remains at the apex of the wire and has then to be eliminated, particularly by etching.

Furthermore, when growing wires catalytically, metal catalyst residues may remain on the surface of the wires. This phenomenon is described, for example in the article by M. I. den Hertog et al. (Nano Letters 8, 1544-1550 (2008)), in the case of silicon wires developed by the vapor-liquid-solid mechanism with gold catalysis.

In fact, metal catalyst residues are harmful in respect of a large number of applications. For example, for silicon wires intended for uses in electronics or photovoltaics, the presence of metals such as gold or copper brings about significant deterioration in the performance of the devices, as these metals cause the appearance of deep electronic traps in the forbidden band of silicon.

A common solution for eliminating the metal catalyst residues on the surface of the wires comprises etching the metal, using a wet process or dry process, after growth of the wires.

However, eliminating metal catalyst residues by etching the metal is often of limited effectiveness. In particular, for wires comprising materials that are air oxidizable, as is the case with silicon, metal etching may become ineffectual through the formation, on the surface of the wire, of a layer of oxide.

There is therefore an obvious need to develop new technical solutions to eliminate the catalyst residues present on the surface, and particularly on the side, of solid structures in the form of wires developed by catalytic growth.

SUMMARY OF THE INVENTION

This invention concerns a method for eliminating the metal catalyst residues present on the surface of wires, or more generally solid structures, developed by catalytic growth. Such a method proves more effective than straightforwardly etching the metal as carried out in the prior art.

Indeed, in so far as these residues are of catalyst material, it is proposed to grow secondary wires from these residues. These secondary wires must be made of a specific material that is easy to eliminate without damaging the main wires. When these secondary wires are removed, the residues normally taken along to the free ends of these wires are eliminated.

To be more specific, the invention relates to a method for eliminating catalyst residues present on the surface of solid structures made from a first material and obtained by catalytic growth, which includes the following steps:
  catalytic growth, from the catalyst residues, of solid structures made from a second material;
  selective elimination of said solid structures made from a second material.

This invention therefore relates to the catalytic growth of solid structures that to advantage assume the form of wires and even more advantageously nanowires (conventionally less than 500 nanometers, and of the order of 100 nanometers, in diameter).

In a manner known to those skilled in the art, this technique comprises growing, from a pad or drop of catalyst deposited on a substrate, a solid structure made from a given material, and doing so by supplying a precursor of said material, the latter being able to be in gaseous, liquid or solid form (Cf. Kolasinski).

The catalyst is to advantage metal, and even more advantageously selected from the following group: copper, gold, platinum and aluminum.

Also in a known manner, the structure is grown under the catalyst and the structure draws the catalyst along essentially at the apex thereof (at its free end), with residues on the sides, i.e. on the surfaces parallel to the growth axis.

The catalyst is traditionally eliminated from the apex of the structure by etching, i.e. using a chemical or electrochemical method by which the catalyst is selectively etched. The method of the invention can be used more generally and more effectively to eliminate any catalyst residue present on the surface of the solid structure made from the first material, which may be termed, in the remainder of the disclosure, main wire.

It is therefore a matter of using the catalyst residues present on the surface of the main structure for the catalytic growth of solid structures made from a second material, which may be termed, in the remainder of the disclosure, secondary or sacrificial wires.

For this growth to occur, the following elements must be combined:
  selecting a precursor of the second material whereof the growth can be catalyzed by the catalyst that has been used for the growth of the first material;
  supplying this precursor;
  bringing together the conditions required for catalytic growth (temperature, pressure).

Again, the growth of these secondary structures will bring about the migration of the catalyst residues on the surface thereof, and in particular at the apex thereof, i.e. at the free end thereof.

In practice, in so far as the size of the pads or drops of catalyst partly determines the size or diameter of the solid structures, and in particular the wires, the diameter of the main wire is preferentially greater than the diameter of the sacrificial wires. Typically, the diameter of the sacrificial wires is to advantage between 1 nanometer and 10 nanometers, the diameter of the main wire then being in excess of 10 nanometers.

At the end of this catalytic growth, the sacrificial wires therefore form branches on the main wire.

The second step in this method comprises selectively eliminating said solid structures made from a second material. Indeed, their elimination causes the concomitant elimination of the catalyst residues and therefore allows the intended aim to be achieved. In a preferred manner, this elimination is comprehensive, in other words at the end of this step, second material and catalyst are absent from the main structure which is now the only one left.

As already stated, a second important criterion is the selectivity of this elimination. Indeed, the elimination of the first material constituting the main solid structure must be reduced as far as possible.

This selective elimination may be implemented by a physical approach, for example by ionic bombardment. However and to advantage according to the invention, this elimination is implemented by etching, a chemical attack that can occur by wet process or dry process.

Put another way, it is necessary to select a chemical solution and (first and second) materials such that the solution attacks the second material at a faster rate than it attacks the first material. To advantage, the rate at which the first material is attacked is less than at least 10 times the rate at which the second material is attacked.

In these conditions, it is possible to etch the sacrificial wires entirely, while limiting the etching of the main wire.

In the context of the invention, the first material constituting the main structure and therefore of concern to us is to advantage chosen from the following group: silicon (Si), germanium (Ge), silicon-germanium (Si—Ge), silica ($SiO_2$), alumina ($Al_2O_3$), type II-VI semi-conductors, type III-V semi-conductors such as gallium arsenide (GaAs), and to even greater advantage silicon.

Thus and by way of example, if the first material is silicon (Si) and the catalyst is gold (Au), silicon-germanium Si—Ge, and particularly $Si_{1-x}Ge_x$ with x=0.4, may be chosen as the second material. The selective elimination may then be carried out by wet etching in an aqueous solution of hydrofluoric acid (HF), nitric acid ($HNO_3$) and acetic acid ($CH_3COOH$).

Alternatively, if the first material is gallium arsenide (GaAs) and the catalyst gold, gallium arsenide (InAs) may be chosen as the second material. The selective elimination may then be carried out by dry etching using gaseous hydrogen chloride (HCl).

Thus and according to a second aspect, this invention also relates to a method for developing solid structures made from a first material, which includes the following steps:
  catalytic growth, from a catalyst, of said solid structures made from a first material;
  elimination of the catalyst residues present on the surface of solid structures by implementing the method described above.

In an intermediate step, i.e. after the step of the catalytic growth of the solid structures made from a first material, it is possible to implement an initial at least partial elimination of the catalyst, and to advantage by etching. In this step and as already described elsewhere, it is possible to eliminate at least partially the catalyst which has been drawn to the free end of the solid structure.

Thus, for the first time and with great effectiveness, this invention can be used to obtain solid structures, and to advantage wires or nanowires, that are free of catalyst on their surface, and particularly on their sides, namely the surfaces parallel to the axis of growth.

As already stated, these solid structures are to advantage made using the following materials: silicon (Si), germanium (Ge), silicon-germanium (Si—Ge), silica ($SiO_2$), alumina ($Al_2O_3$), type II-VI semi-conductors, type III-V semi-conductors such as gallium arsenide (GaAs), and to advantage silicon.

Moreover, these nanowires are to advantage more than 10 nanometers in diameter, possibly reaching 500 nanometers, and to even greater advantage are about 100 nanometers.

BRIEF DESCRIPTION OF THE DRAWINGS

The possible embodiments of the invention and the resulting advantages will become clearer from reading the following implementation examples, given for information purposes and non-restrictively, supported by the appended figures among which.

EMBODIMENT EXAMPLES OF THE INVENTION

1. Principle

Figure 1:
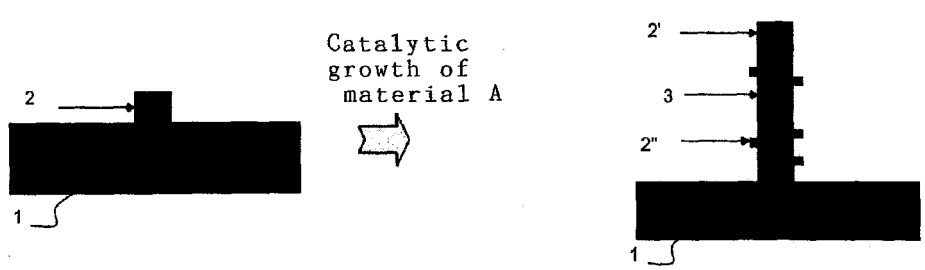
FIG. 1 shows a method for developing nanowires by catalytic growth according to the prior art, including a step of growing the nanowires (A) followed by a step of etching (B).
Figure 1:
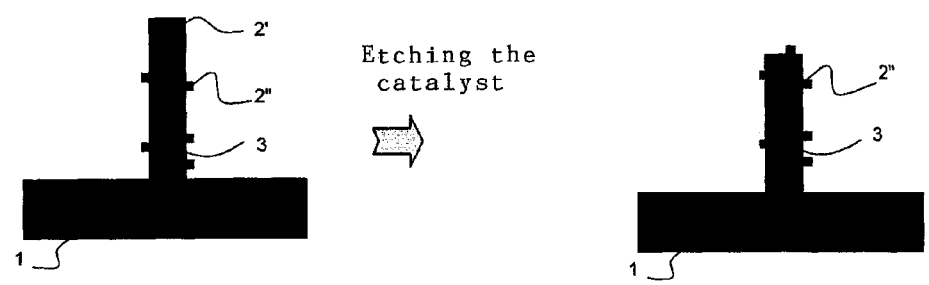
Figure 2:
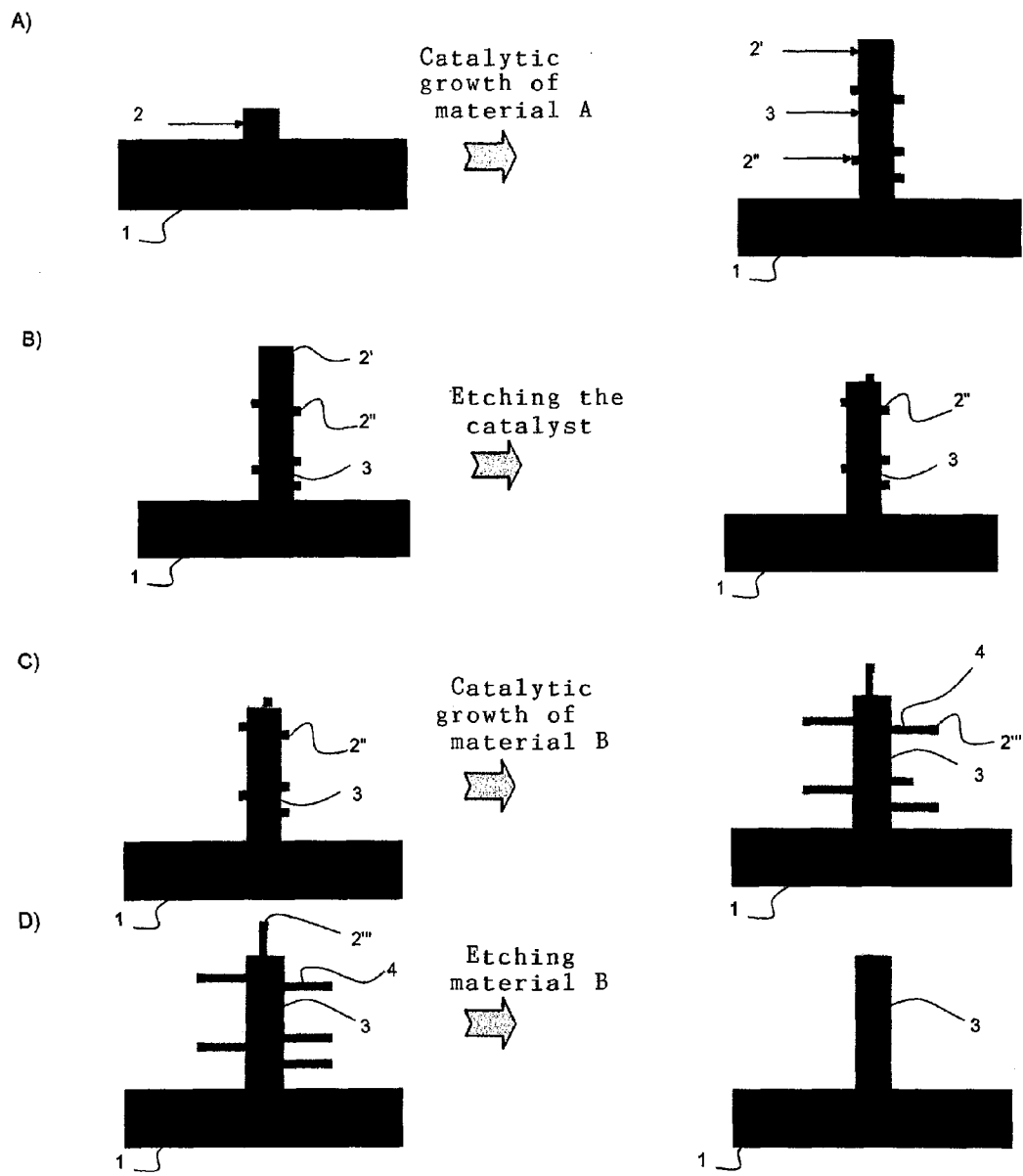
FIG. 2 shows the method of developing nanowires by catalytic growth according to the invention, further including a step of growing a second network of nanowires (C) and then eliminating it by etching (D).

The method of the invention, shown in FIG. 2, starts like the prior art method shown in FIG. 1:

Step 1 (FIG. 1A; FIG. 2A):

A pad of metal catalyst (2) is deposited on the surface of a substrate (1). By supplying a precursor of the material constituting the main wire (material A) and using a vector gas selected as a function of the precursor, the main wire (3) is grown catalytically on the surface of the substrate (1). The wire (3) grows under the pad of catalyst (2) and takes it along with it. At the end of this catalytic growth, the catalyst (2') is essentially at the apex of the wire (3) but catalyst residues (2") are also on the sides of the wire (3).

Step 2 (FIG. 1B; FIG. 2B):

In order to eliminate a maximum amount of catalyst (2', 2"), it is etched by wet process or dry process. This step certainly allows the catalyst (2') at the apex of the wire (3) to be eliminated. However, metal catalyst residues (2") remain on the surface of the main wire (3). This step is optional however.

The method of the invention provides for two successive subsequent steps that can be used to eliminate the metal catalyst residues (2") present on the surface of the main wire (3):

Step 3 (FIG. 2C):

By supplying a precursor of a second material (B) and using a vector gas, the so-called sacrificial wires (4) are grown catalytically on the surface of the main wire (3), from the metal catalyst residues (2'''). The sacrificial wires (4) grow under the catalyst (2'') and take it along with it. At the end of this catalytic growth, the catalyst (2''') is at the apex of the sacrificial wires (4) which form branches on the main wire (3).

Step 4 (FIG. 2D):

Material B is fully etched, by wet process or dry process, which allows the sacrificial wires (4) and thereby also the metal catalyst residues (2''') to be dispensed with.

At the end of this method, the metal catalyst residues present on the sides of the wires we are concerned with, which could not have been dispensed with through conventional etching, have therefore been eliminated.

2. Example 1

Step 1: Growing Silicon Nanowires

The main wire (3) is a silicon wire (Si=material A) 100 nanometers in diameter, developed using a metal catalyst of gold (2).

The operating conditions are as follows:
colloidal gold nanoparticles (100 nm) on Si (111) substrate;
T=650° C.;
P=10 mbar;
mix $SiH_4$ (silane)+$H_2$ (hydrogen);
duration: 20 nm.

Step 2: Gold Etching solution marketed under the reference "IKI2" by the Company VWR Prolabo, constituted by an aqueous solution of KI (potassium iodide) and iodine $I_2$, at ambient temperature;
duration: 10 nm.

Step 3: Growing Silicon-Germanium Nanowires

Catalytic growth of sacrificial wires (4) made of silicon-germanium. ($Si_{1-x}Ge_x$ with x=0.4), from gold residues (2'') present on the surface of the main wire (3).

Operating conditions as follows:
T=550° C.;
P=10 mbar;
mix $SiH_4$ (silane)+$GeH_4$ (germane)+$H_2$ (hydrogen), with ratio [$GeH_4$ flux/$SiH_4$ flux]=1.5;
duration 10 nm.

Step 4: etching silicon-germanium nanowires

Selective etching of the silicon-germanium (=material B) constituting the sacrificial wires (4), by wet etching in an aqueous solution of hydrofluoric acid (HF), nitric acid ($HNO_3$) and acetic acid ($CH3COOH$).

Operating conditions:
aqueous solution of HF (hydrofluoric acid), $HNO_3$ (nitric acid), $CH_3COOH$ (acetic acid), at ambient temperature;
duration: 10 nm.

3. Example 2

Step 1: Growing Nanowires of GaAs

The main wire (3) is a wire of gallium arsenide (GaAs=material A) 100 nm in diameter, developed using a metal catalyst of gold (2).

Operating conditions:
colloidal gold nanoparticles (100 nm) on GaAs (111) substrate;
T=450° C.;
P=100 mbar;
mix TMGa (trimethylgallium)+$AsH_3$ (arsine);
duration: 20 nm.

Step 2: Gold Etching solution marketed under the reference "IKI2" by the Company VWR Prolabo, constituted by an aqueous solution of KI (potassium iodide) and iodine $I_2$, at ambient temperature;
duration: 10 nm.

Step 3: Growing Nanowires of InAs

Catalytic growth of sacrificial wires (4) of indium arsenide (InAs), from gold residues (2'') present on the surface of the main wire (3).

Operating conditions as follows:
T=450° C.;
P=100 mbar;
mix TMIn (trimethylindium)+AsH3 (arsine);
duration 10 nm.

Step 4: Etching Nanowires of InAs

Selective etching of the indium arsenide (=material B) constituting the sacrificial wires (4), by dry etching using gaseous hydrogen chloride (HCl) at 300° C. for 10 minutes.

The invention claimed is:

1. A method for eliminating catalyst residues present on the surface of solid structures, wherein the solid structures are made from a first material and obtained by catalytic growth from a surface of a substrate, the method comprising the steps of:
    (a) catalytically growing, from the catalyst residues present on the surface of the solid structures made from the first material, solid structures made from a second material on the solid structures made from the first material; and
    (b) after the step of catalytically growing the solid structures made from the second material on the solid structures made from the first material, selectively eliminating said solid structures made from the second material, thereby eliminating the catalyst residues.

2. The method for eliminating catalyst residues as claimed in claim 1, wherein the solid structures are wires.

3. The method for eliminating catalyst residues as claimed in claim 2, wherein the wires are nanowires.

4. The method for eliminating catalyst residues as claimed in claim 1, wherein the catalyst is a metal catalyst.

5. The method for eliminating catalyst residues as claimed in claim 4, wherein the metal catalyst is selected from the group consisting of copper, gold, platinum and aluminum.

6. The method for eliminating catalyst residues as claimed in claim 1, wherein the first material is selected from the group consisting of silicon, germanium, silicon-germanium, silica, alumina, type II-VI semi-conductors, and type III-V semi-conductors.

7. The method for eliminating catalyst residues as claimed in claim 6, wherein the semi-conductor is gallium arsenide or silicon.

8. The method for eliminating catalyst residues as claimed in claim 1, wherein the step of selectively eliminating the solid structures made from the second material comprises the step of etching, using a wet process or dry process.

9. The method for eliminating catalyst residues as claimed in claim 1, wherein the second material is chemically attacked by a given solution at a faster rate than the first material is attacked.

10. The method for eliminating catalyst residues of claim 1, wherein the solid structures are obtained by catalytic growth from a pad or drop of catalyst deposited on the substrate.

11. A method for producing solid structures made from a first material comprising the steps of:
 (a) catalytically growing, from a catalyst on the surface of a substrate, solid structures made from the first material; and
 (b) eliminating catalyst residues present on the surface of said catalytically-grown solid structures made from the first material, said eliminating step comprising:
  (i) catalytically growing, from the catalyst residues on the surface of the solid structures made from the first material, solid structures made from a second material; and
  (ii) after the step of catalytically growing the solid structures made from the second material on the solid structures made from the first material, selectively eliminating said solid structures made from the second material, thereby eliminating the catalyst residues on the surface of the solid structures made from the first material.

12. The method for producing solid structures made from a first material as claimed in claim 11, comprising, after the step of catalytically growing said solid structures made from the first material, the step of at least partially eliminating the catalyst by etching.

* * * * *

UNITED STATES PATENT AND TRADEMARK OFFICE
CERTIFICATE OF CORRECTION

PATENT NO.         : 8,669,171 B2
APPLICATION NO.    : 13/220395
DATED              : March 11, 2014
INVENTOR(S)        : Simon Perraud et al.

Page 1 of 1

It is certified that error appears in the above-identified patent and that said Letters Patent is hereby corrected as shown below:

On the title page item (73)   Assignee:   Change name of Assignee from "Commissariat a l'Energie Atmoique et aux Energies Alternatives, Paris (FR)" to --Commissariat a l'Energie Atomique et aux Energies Alternatives, Paris (FR)--

Signed and Sealed this
Twentieth Day of May, 2014

Michelle K. Lee
*Deputy Director of the United States Patent and Trademark Office*